(12) United States Patent
Miyashita et al.

(10) Patent No.: US 7,741,689 B2
(45) Date of Patent: Jun. 22, 2010

(54) PHOTOELECTRIC CONVERSION LAYER-STACKED SOLID-STATE IMAGING ELEMENT

(75) Inventors: Takeshi Miyashita, Asaka (JP); Takeshi Misawa, Asaka (JP)

(73) Assignee: Fujifilm Corporation, Tokyo (JP)

( * ) Notice: Subject to any disclaimer, the term of this patent is extended or adjusted under 35 U.S.C. 154(b) by 293 days.

(21) Appl. No.: 11/356,032

(22) Filed: Feb. 17, 2006

(65) Prior Publication Data

US 2006/0181629 A1   Aug. 17, 2006

(30) Foreign Application Priority Data

Feb. 17, 2005   (JP)   ............... P. 2005-040386

(51) Int. Cl.
   *H01L 29/78*   (2006.01)
(52) U.S. Cl. ............... 257/435; 257/431; 257/E33.001
(58) Field of Classification Search ................... 257/435
   See application file for complete search history.

(56) References Cited

U.S. PATENT DOCUMENTS

| | | | | |
|---|---|---|---|---|
| 5,352,886 | A * | 10/1994 | Kane | 250/216 |
| 2003/0122209 | A1 * | 7/2003 | Uya | 257/435 |
| 2004/0132262 | A1 * | 7/2004 | Ayabe et al. | 438/428 |
| 2005/0236653 | A1 * | 10/2005 | Lim | 257/294 |

FOREIGN PATENT DOCUMENTS

| | | |
|---|---|---|
| JP | 58-103165 A | 6/1983 |
| JP | 61-204967 | 11/1986 |
| JP | 63-086474 | 4/1988 |
| JP | 01-295457 | 11/1989 |
| JP | 05-121708 A * | 5/1993 |
| JP | 2002-83946 A | 3/2002 |
| JP | 2002083946 A * | 3/2002 |
| JP | 3405099 B2 | 3/2003 |
| JP | 2003-282850 | 10/2003 |

\* cited by examiner

*Primary Examiner*—Kenneth A Parker
*Assistant Examiner*—Anthony Ho
(74) *Attorney, Agent, or Firm*—Birch, Stewart, Kolasch & Birch, LLP

(57) ABSTRACT

A photoelectric conversion layer-stacked solid-state imaging element comprises: a semiconductor substrate having a signal reading circuit formed thereon; at least one layer of photoelectric conversion layer each of which is provided interposed between a common electrode layer and a plurality of pixel electrode layers corresponding to pixels, said at least one layer of photoelectric conversion layer being stacked above the semiconductor substrate via a light shielding layer; and inhibiting structures each of which inhibits a reflected light produced by reflection of incident light on the light shielding layer, the incident light having passed through said at least one layer of photoelectric conversion layer and entered into a pixel, from entering in direction toward adjacent pixels.

8 Claims, 5 Drawing Sheets

US 7,741,689 B2

PHOTOELECTRIC CONVERSION LAYER-STACKED SOLID-STATE IMAGING ELEMENT

BACKGROUND OF THE INVENTION

1. Field of the Invention

The present invention relates to a solid-state imaging element comprising a plurality of photoelectric conversion layers stacked on a semiconductor substrate having a signal reading circuit formed thereon and particularly to a photoelectric conversion layer-stacked solid-state imaging element comprising a light shielding layer provided interposed between the lowermost photoelectric conversion layer and the semiconductor substrate.

2. Description of the Related Art

A prototype example of photoelectric conversion layer-stacked solid-state imaging element is one disclosed in JP-A-58-103165. This solid-state imaging element comprises three light-sensitive layers stacked on a semiconductor substrate. In this arrangement, Red (R), green (G) and blue (B) electrical signals detected in the respective light-sensitive layer are read out by MOs circuit formed on the semiconductor substrate.

The solid-state imaging element having the aforementioned configuration was proposed in the past. Since then, CCD type image sensors or CMOS type image sensors comprising a numeral light-receiving portions (photodiode) integrated on the surface of a semiconductor substrate and various color filters of red (R), green (G) and blue (B) have shown a remarkable progress. The present technical trend is such that an image sensor having millions of light-receiving portions (pixels) integrated on one chip is incorporated in digital still cameras.

However, the technical progress of CCD type image sensors and CMOS type images has been almost limited. The size of the opening of one light-receiving portion is about 2 μm, which is close to the order of wavelength of incident light. Therefore, these types of image sensors face a problem of poor yield in production.

Further, the upper limit of the amount of photocharge that can be stacked in one fine light-receiving portion is as low as about 3,000 electrons, with which 256 gradations can be difficultly expressed completely. Therefore, it has been difficult to expect CCD type or CMOS type image sensor that outperforms the related art products from the standpoint of image quality or sensitivity.

As a solid-state imaging element that gives solution to these problems, a solid-state imaging element proposed in JP-A-58-103165 has been reviewed. Image sensors disclosed in Japanese Patent Application No. 3405099 and JP-A-2002-83946 have been newly proposed.

In the image sensor described in Japanese Patent Application No. 3405099, three photoelectric conversion layers having a ultraparticulate silicon having different diameters dispersed in a medium are stacked on a semiconductor substrate. The various photoelectric conversion layers generate electric signal according to the amount of red, green and blue lights received, respectively.

The image sensor described in JP-A-2002-83946 is similar to that of Japanese Patent Application No. 3405099. Three nanosilicon layers having different particle diameters are stacked on a semiconductor substrate. Red, green and blue electric signals detected by the respective nanosilicon layers are read out by storage diodes formed on the surface of the semiconductor substrate.

FIG. 5 is a diagrammatic sectional view of a two pixel portion of a related art photoelectric conversion layer-stacked solid-state imaging element. In FIG. 5, on the surface portion of a P-well layer 1 formed on an n-type silicon substrate are formed a high concentration impurity region 2 for storing red signal, an MOS circuit 3 for reading out red signal, a high concentration impurity region 4 for storing green signal, an MOS circuit 5 for reading out green signal, a high concentration impurity region 6 for storing blue signal and an MOS circuit 7 for reading out blue signal.

These MOS circuits 3, 5 and 7 are each formed by impurity regions for source and drain formed on the surface of the semiconductor substrate and a gate electrode formed via a gate insulating layer 8. On the top of the gate insulating layer 8 and the gate electrode is stacked an insulating layer 9 to level the surface thereof. On the insulating layer 9 is stacked a light shielding layer 10. In most cases, the light shielding layer 10 is formed a thin metal layer. Therefore, an insulating layer 11 is formed on the light shielding layer 10.

The signal charge stored in the high concentration impurity regions 2, 4 and 6 for storing color signal are read out by the MOS circuits 3, 5 and 7, respectively.

On the insulating layer 11 shown in FIG. 5 is formed a pixel electrode layer 12 defined every pixel. The pixel electrode 12 for each pixel is electrically conducted to the red signal storing high concentration impurity region 2 for each pixel via a columnar electrode 13. The contact electrode 13 is electrically insulated from the parts other than the pixel electrode layer 12 and the high concentration impurity region 2.

On the top of the various pixel electrode layers 12 is stacked one sheet of a red signal detecting photoelectric conversion layer 14 common to all the pixels. On the top of the photoelectric conversion layer 14 is formed one sheet of a transparent common electrode layer 15 common to all the pixels.

Similarly, on the top of the common electrode layer 15 is formed a transparent insulating layer 16 on the top of which a pixel electrode layer 17 defined every pixel is formed. The various pixel electrode layers 17 and the corresponding green signal storing high concentration impurity regions 4 are respectively conducted to each other via a columnar contact electrode 18. The contact electrode 18 is electrically insulated from the parts other than the pixel electrode layer 17 and the high concentration impurity region 4. On the top of the various pixel electrode layers 17 is formed one sheet of a green detecting photoelectric conversion layer 19 as in the photoelectric conversion layer 14. On the top of the photoelectric conversion layer 19 is formed a transparent common electrode layer 20.

On the top of the common electrode layer 20 is formed a transparent insulating layer 21 on the top of which a pixel electrode layer 22 defined every pixel is formed. The various pixel electrode layers 22 and the corresponding blue signal storing high concentration impurity regions 6 are respectively conducted to each other via a columnar contact electrode 26. The contact electrode 26 is electrically insulated from the parts other than the pixel electrode layer 22 and the high concentration impurity region 6. On the top of the pixel electrode layers 22 is stacked one sheet of a blue detecting photoelectric conversion layer 23 common to all the pixels. On the top of the photoelectric conversion layer 23 is formed a transparent common electrode layer 24. A transparent protective layer 25 is formed as an uppermost layer.

When light is incident on this solid-state imaging element, photocharge is excited in the photoelectric conversion layers 23, 19 and 14 according to the amount of incident blue, green and red lights, respectively. When a voltage is applied across the common electrode layers 24, 20 and 15 and the pixel electrode layers 22, 17 and 12, respectively, the respective photocharge flows into the high concentration impurity regions 2, 4 and 6 from which it is then read out as blue, green and red signals by the MOS circuits 3, 5 and 7, respectively.

Among the components of light 50 which is obliquely incident on the related art photoelectric conversion layer-stacked solid-state imaging element shown in FIG. 5, blue light is absorbed by the photoelectric conversion layer 23, green light is absorbed by the photoelectric conversion layer 19, red light is absorbed by the photoelectric conversion layer 14, and infrared light hits the light shielding layer 10. The infrared light is converted to heat by the light shielding layer 10 but is partly reflected by the light shielding layer 10.

Though depending on the material constituting the photoelectric conversion layers 14, 19 and 23 and other factors, visible light which has been left unabsorbed by the photoelectric conversion layers 14, 19 and 23, too, is reflected by the light shielding layer 10. The reflected light 51 comes back sequentially through the photoelectric conversion layers 14, 19 and 23 to generate photocharge again therein.

As shown in FIG. 5, when the obliquely incident light 50 is reflected in the vicinity of the pixel border, the pixel which generates signal charge by incident light 50 and the pixel which generates signal charge by reflected light 51 are different from each other, causing insufficient separation of signal charge by pixels. Further, problem of color mixing among pixels cannot be neglected.

SUMMARY OF THE INVENTION

An aim of the invention is to provide a photoelectric conversion layer-stacked solid-state imaging element which can sufficiently separate signal charge by pixels and avoid color mixing among pixels to take a high quality color image.

The photoelectric conversion layer-stacked solid-state imaging element of the invention comprises a semiconductor substrate having a signal reading circuit formed thereon; at least one layer of photoelectric conversion layer each of which is provided interposed between a common electrode layer and a plurality of pixel electrode layers corresponding to pixels, said at least one layer of photoelectric conversion layer being stacked above the semiconductor substrate via a light shielding layer; and inhibiting structures each of which inhibits a reflected light produced by reflection of incident light on the light shielding layer, the incident light having passed through said at least one layer of photoelectric conversion layer and entered into a pixel, from entering in direction toward adjacent pixels to the pixel.

The invention also concerns the aforementioned photoelectric conversion layer-stacked solid-state imaging element, wherein the inhibiting structures comprise shielding walls each of which is erected at a pixel border portion on the light shielding layer.

The invention further concerns the aforementioned photoelectric conversion layer-stacked solid-state imaging element, wherein the inhibiting structures comprise concave portions formed on the light shielding layer, in which the concave portions have a sectional shape of which light shielding layer is concave, and each of the concave portions is located at a lower part of each of the pixels.

The invention further concerns the aforementioned photoelectric conversion layer-stacked solid-state imaging element, wherein the inhibiting structure comprises both of the shielding walls and the concave portions.

The invention further concerns the aforementioned photoelectric conversion layer-stacked solid-state imaging element, wherein each of the concave portions comprises: a first region having a first depth, corresponding to a periphery portion of each of the pixels; and a second region having a second depth greater than the first depth, corresponding to a center portion of each of the pixels.

The invention further concerns the aforementioned photoelectric conversion layer-stacked solid-state imaging element, wherein the concave portions have depths increasing from a center of a light-receiving surface of the solid-state imaging element toward a periphery of the light-receiving surface.

DETAILED DESCRIPTION OF THE INVENTION

An embodiment of implementation of the invention will be described hereinafter in connection with the attached drawings.

First Embodiment

Figure 1:
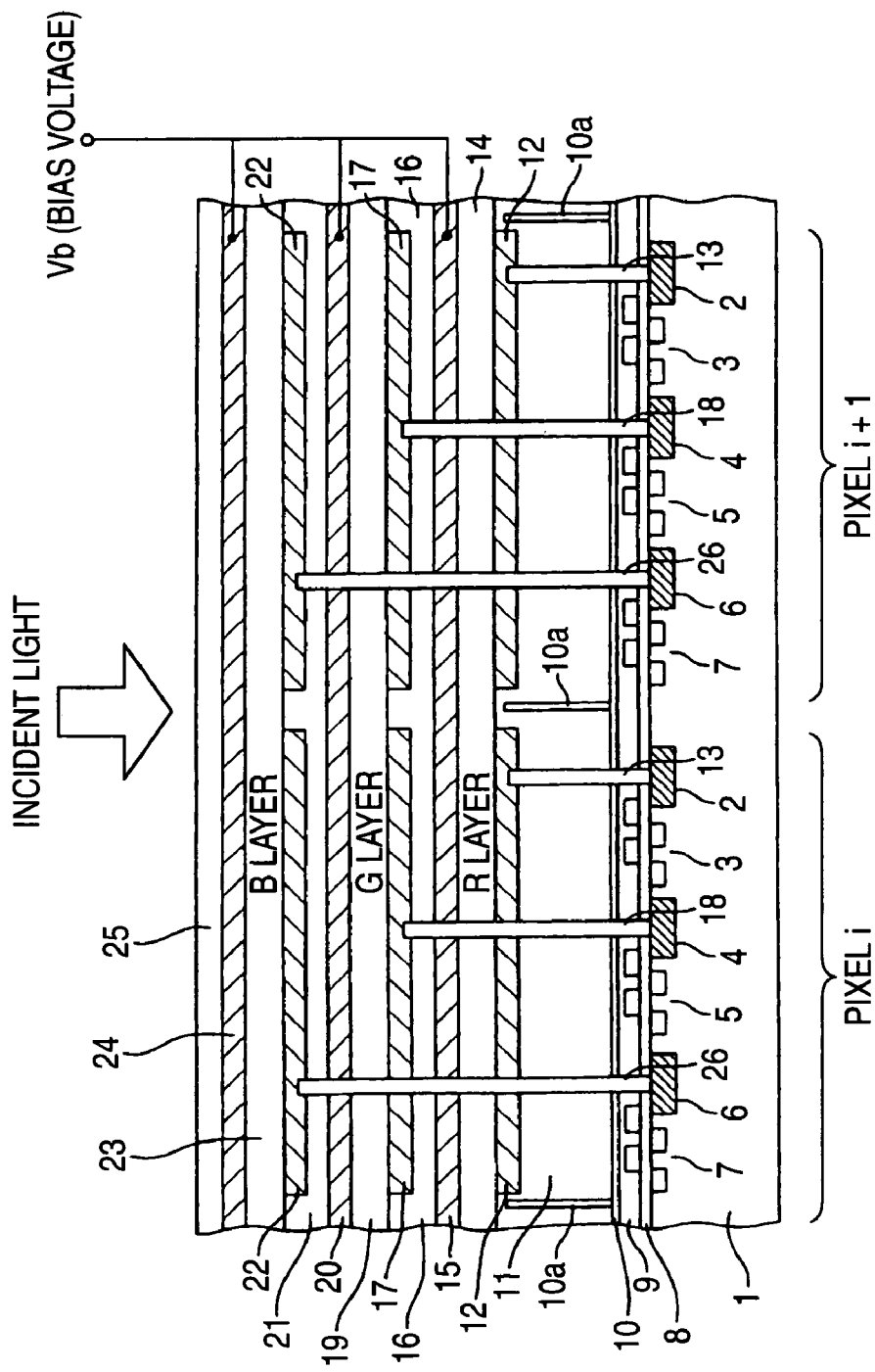
FIG. 1 is a diagrammatic sectional view of a two pixel portion of a photoelectric conversion layer-stacked solid-state imaging element according to a first embodiment of implementation of the invention.
Figure 5:
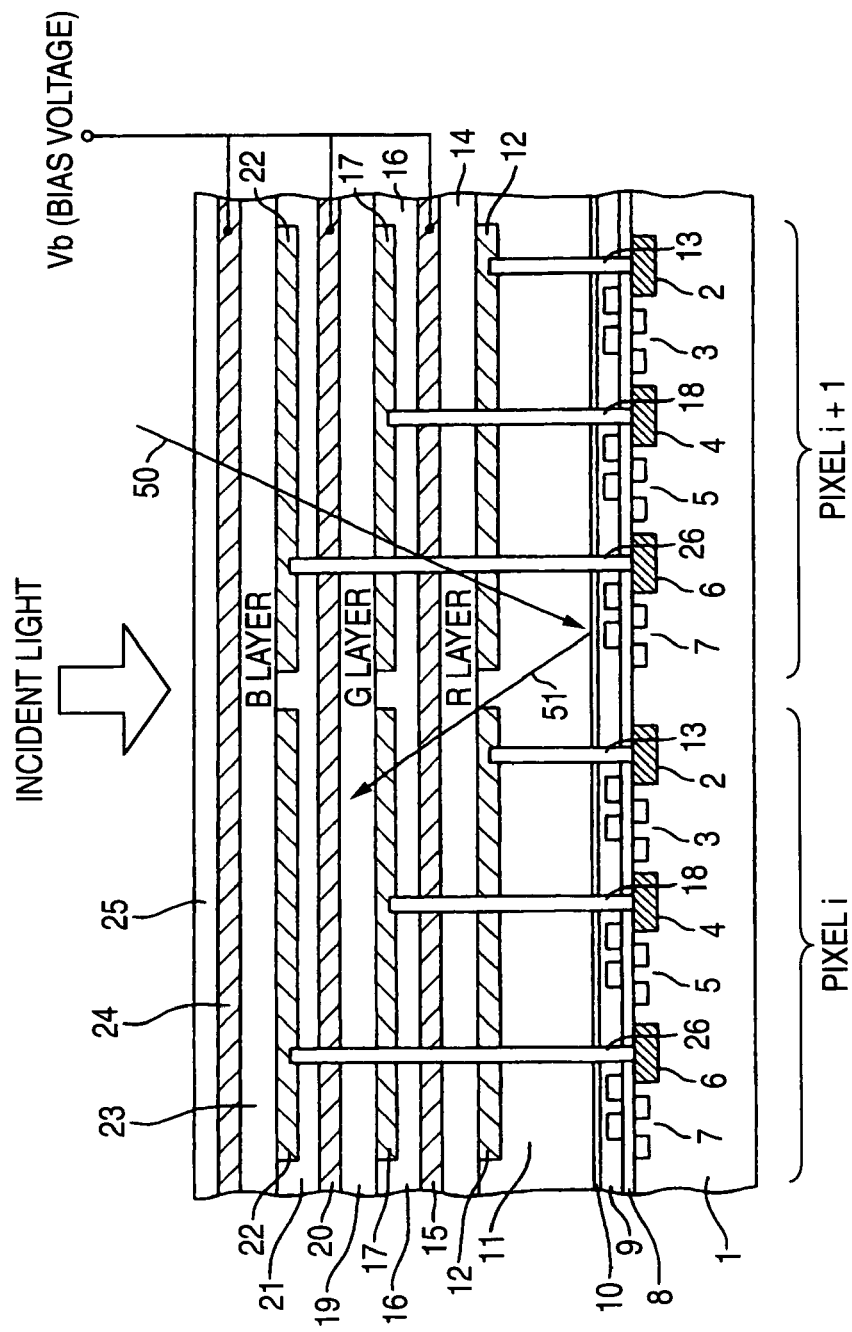
FIG. 5 is a diagrammatic sectional view of a two pixel portion of a related art photoelectric conversion layer-stacked solid-state imaging element.

FIG. 1 is a diagrammatic sectional view of a two pixel portion of a photoelectric conversion layer-stacked solid-state imaging element according to a first embodiment of implementation of the invention. Since the basic configuration of the present embodiment is the same as that of the related art photoelectric conversion layer-stacked solid-state imaging element explained in FIG. 5, like numerals are used where the members are the same as those of the related art photoelectric conversion layer-stacked solid-state imaging element. Where the members are the same as those of the related art photoelectric conversion layer-stacked solid-state imaging element, no description is made.

Figure 2:
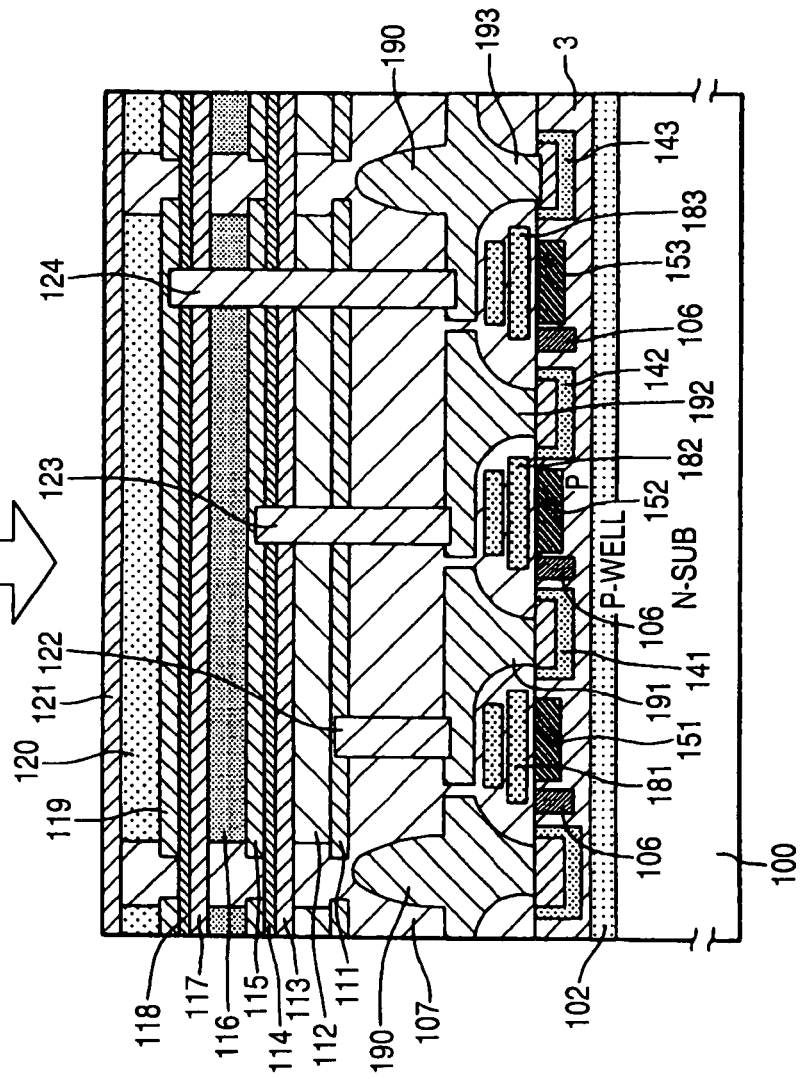
FIG. 2 is a diagrammatic sectional view of a one pixel portion of a photoelectric conversion layer-stacked solid-state imaging element according to a second embodiment of implementation of the invention.

In the photoelectric conversion layer-stacked solid-state imaging element according to the present embodiment, a shielding wall 10a made of the same material as that of a light shielding layer 10 is provided erected on the light shielding layer 10 at the pixel border portion in an insulating layer 11. The shielding wall 10a is preferably formed as high as possible. However, since the shielding wall 10a is obstructed by the lowermost common electrode layer 15, which is formed by one sheet of layer, and in the example of FIG. 1, the photoelectric conversion layer 14, too, is formed by one sheet common to all the pixels, the shielding wall 10a has a height such that the top thereof is close to the photoelectric conversion layer 14. The provision of the shielding wall 10a causes light reflected by the light shielding layer 10 at the pixel border portion to be reflected by the shielding wall 10a and then enter the same pixel as passes the incident light, preventing color mixing among pixels and enhancing the capability of separating signal charge by pixels.

Second Embodiment FIG. 2 is a diagrammatic sectional view of a one pixel portion of a photoelectric conversion layer-stacked solid-state imaging element according to a second embodiment of implementation of the invention. On the surface portion of a semiconductor substrate 100 is formed a signal reading circuit. The signal reading circuit may be formed by an MOS transistor circuit as in FIG. 1. In the present embodiment, however, the signal reading circuit is formed by a charge transmission channel as in the related art CCD type image sensor.

In the photoelectric conversion layer-stacked solid-state imaging element shown in FIG. 2, a P-well layer 102 is formed on the surface portion of an n-type semiconductor substrate 100. In a P-region 103 on the surface portion of the P-well layer 102 are formed a diode portion 141 which is a first color charge accumulating region, a diode portion 142 which is a second color charge accumulating region and a diode portion 143 which is a third color charge accumulating region. Formed between the diode portion 141 and the diode portion 142, between the diode portion 142 and the diode portion 143 and between the diode portion 143 and the diode portion 141 are charge transmission channels 152, 153 and 151, respectively. Formed between the pair of the diode portion 141 and the charge transmission channel 151, between the pair of the diode 142 and the charge transmission channel 152 and between the pair of the diode 143 and the charge transmission channel 153 are each a channel stopper 106 made of p+ region.

On the surface of the semiconductor substrate 100 is stacked an insulating layer 107. In the insulating layer 107 are formed charge transmission electrodes 181, 182 and 183 on the charge transmission channels 151, 152 and 153, respectively. In the insulating layer 107 are also embedded electrodes 191, 192 and 193 which are connected to the diode portions 141, 142 and 143, respectively. The electrodes 191, 192 and 193 according to the present embodiment are formed covering the charge transmission electrodes 181, 182 and 183, respectively, to act also as a light shielding layer for preventing incident light (mainly infrared light because the visible light portion in incident light is almost absorbed by the upper photoelectric conversion layer) from entering into the charge transmission electrodes 181, 182 and 183.

The light shielding layer (electrodes 191, 192, 193) according to the present embodiment is formed having a flat surface and a convex portion (shielding wall) erected upward at the pixel border portion.

On the insulating layer 107 is stacked a first color pixel electrode layer 111 defined every pixel. The pixel electrode layer 111 is formed by a transparent material.

On the various pixel electrode layers 111 are each stacked a first photoelectric conversion layer 112 defined every pixel which performs photoelectric conversion of first color incident light. On the first photoelectric conversion layer 112 is stacked a transparent common electrode layer (counter electrode layer of pixel electrode layer 111) 113.

On the common electrode layer 113 is stacked a transparent insulating layer 114 on which a second color transparent pixel electrode layer 115 defined every pixel is stacked. On the various pixel electrode layers 115 are each stacked a second photoelectric conversion layer 116 defined every pixel which performs photoelectric conversion of second color incident light. On the second photoelectric conversion layer 116 is stacked a transparent common electrode layer (counter electrode of pixel electrode layer 115) 117.

On the common electrode layer 117 is stacked a transparent insulating layer 118 on which a third color transparent pixel electrode layer 119 defined every pixel is stacked. On the various pixel electrode layers 119 are each stacked a third photoelectric conversion layer 120 defined every pixel which performs photoelectric conversion of third color incident light. On the third photoelectric conversion layer 120 is stacked a transparent common electrode layer (counter electrode of pixel electrode layer 119) 121. On the transparent common electrode layer 121 may be formed a protective layer, but this is not shown.

The first color pixel electrode layer 111 is electrically connected to the electrode 191 of the first color charge accumulating diode portion 141 via a columnar contact electrode 122. The second color pixel electrode layer 115 is electrically connected to the electrode 192 of the second color charge accumulating diode portion 142 via a columnar contact electrode 123. The third color pixel electrode layer 119 is electrically connected to the electrode 193 of the third color charge accumulating diode portion 143 via a columnar contact electrode 124. The various contact electrodes 122, 123 and 124 are insulated from the parts other than the corresponding electrodes 191, 192 and 193 and pixel electrode layers 111, 115 and 119.

It doesn't matter which the material constituting the various photoelectric conversion layers 112, 116 and 120 is organic or inorganic. However, these photoelectric conversion layers are each preferably formed by a direct transition type thin layer structure, particulate structure or Gratzel structure. When these photoelectric conversion layers are each formed by a particulate structure, the band gap end can be controlled. For example, by controlling the diameter of nano-particles such as CdSe, InP, ZnTe and ZnSe, the wavelength range within which photo electric conversion is conducted can be controlled.

In the photoelectric conversion layer-stacked solid-state imaging element according to the present embodiment, a convex portion 190 is provided at the pixel border portion on the light shielding layer (electrodes 191, 192 and 193) as previous mentioned. In order that light reflected by the light shielding layer might be deterred by the convex portion 190 from entering the adjacent pixels, the height of the convex portion 190 is preferably higher. However, since the convex portion 190 cannot be produced such that it pierces the common electrode layer 113, which is formed by one sheet common to all the pixels, it is preferred that the insulating layer that fills the gap between the photoelectric conversion layers 112, 116 and 120 of the pixel adjacent to the photoelectric conversion layers 112, 116 and 120 which are separated from each other every pixel be an opaque insulating layer.

Let us now suppose that the first color is red (R), the second color is green (G) and the third color is blue (B). When light is incident on the photoelectric conversion layer-stacked solid-state imaging element, the light having a blue wavelength range in the incident light is absorbed by the third photoelectric conversion layer 120. An electric charge is then generated according to the amount of light absorbed. This electric charge flows from the pixel electrode layer 119 into the diode portion 143 through the contact electrode 124 and the electrode 193.

Similarly, the light having a green wavelength range in the incident light is transmitted by the third photoelectric conversion layer 120 and absorbed by the second photoelectric conversion layer 116. An electric charge is then generated according to the amount of light absorbed. This electric charge flows from the pixel electrode layer 115 into the diode portion 142 through the contact electrode 123 and the electrode 192.

Similarly, the light having a red wavelength range in the incident light is transmitted by the third and second photoelectric conversion layers 120 and 116 and absorbed by the first photoelectric conversion layer 112. An electric charge is then generated according to the amount of light absorbed. This electric charge flows from the pixel electrode layer 111 into the diode portion 141 through the contact electrode 122 and the electrode 191.

The fetch of signal from the diode portions 141, 142 and 143 can be made according to a method of fetching signal from ordinary silicon light-receiving element. For example, a predetermined amount of bias charge is previously injected into the diode portions 141, 142 and 143 (refresh mode). When light is then incident on these diode portions, a predetermined amount of charge is stacked in these diode portions (photoelectric conversion mode). Thereafter, signal charge is read out from these diode portions. An organic light-receiving element itself may be used as a storage diode. Alternatively, a storage may be separately provided.

When, among the light components which have been obliquely incident on the photoelectric conversion layer-stacked solid-state imaging element, the light components which have been left unabsorbed by the photoelectric conversion layers 112, 116 and 120 are reflected by the light shielding layer (electrodes 191, 192 and 193) toward the adjacent pixels, they are then reflected by the convex portion 190 toward the original pixel. In this manner, color mixing among pixels can be avoided.

Third Embodiment

Figure 3:
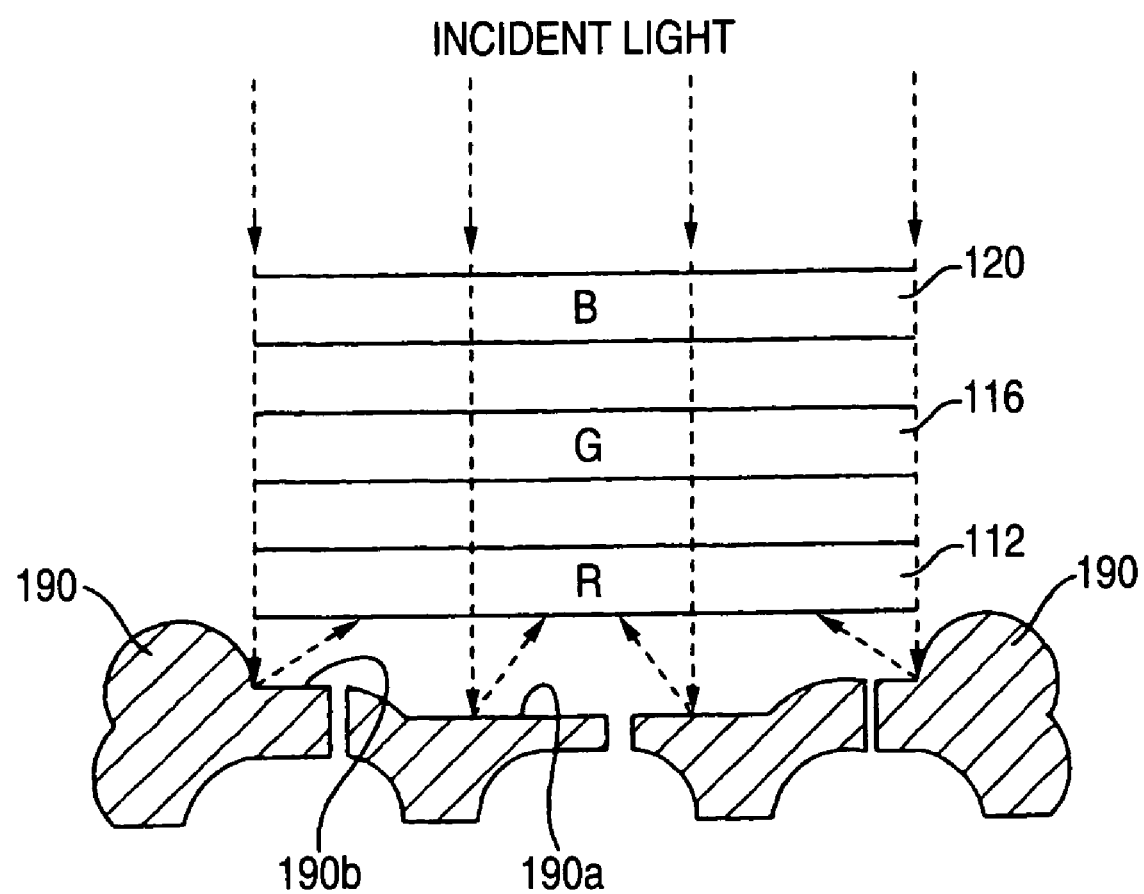
FIG. 3 is a diagram illustrating the configuration of the light shielding layer (lower electrode) of a photoelectric conversion layer-stacked solid-state imaging element according to a third embodiment of implementation of the invention.

FIG. 3 is a diagram illustrating the configuration of the light shielding layer (lower electrode) of a photoelectric conversion layer-stacked solid-state imaging element according to a third embodiment of implementation of the invention. In the first and second embodiments, the shape of the portion of the light shielding layer interposed between the shielding walls (convex portion) 10a and 190 provided at the pixel border portion is flat. However, the photoelectric conversion layer-stacked solid-state imaging element according to the present embodiment is arranged such that light reflected by the light shielding layer under the original pixel goes toward the original pixel rather than the adjacent pixels.

In some detail, in the photoelectric conversion layer-stacked solid-state imaging element according to the present embodiment, the surface of the lower electrode interposed between the shielding walls 190 is concave such that the surface level is low at the central portion 190a of the pixel and slightly higher at the peripheral portion 190b of the pixel. In this arrangement, the light reflected by the surface of the light shielding layer can efficiently go toward the original pixel.

Fourth Embodiment

Figure 4A:
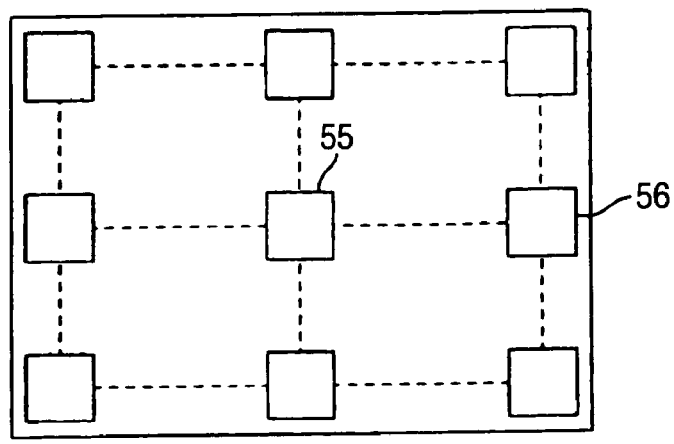
FIG. 4 is a diagram illustrating a photoelectric conversion layer-stacked solid-state imaging element according to a fourth embodiment of implementation of the invention.

FIG. 4 is a diagram illustrating a photoelectric conversion layer-stacked solid-state imaging element according to a fourth embodiment of implementation of the invention. FIG. 4A is a diagrammatic plan view of the light-receiving surface of the photoelectric conversion layer-stacked solid-state imaging element. Numeral pixels shown in rectangular form are two-dimensionally aligned vertically and horizontally. The various pixels each are arranged to detect three color signals, i.e., red (R), green (G) and blue (B).

Figure 4B:
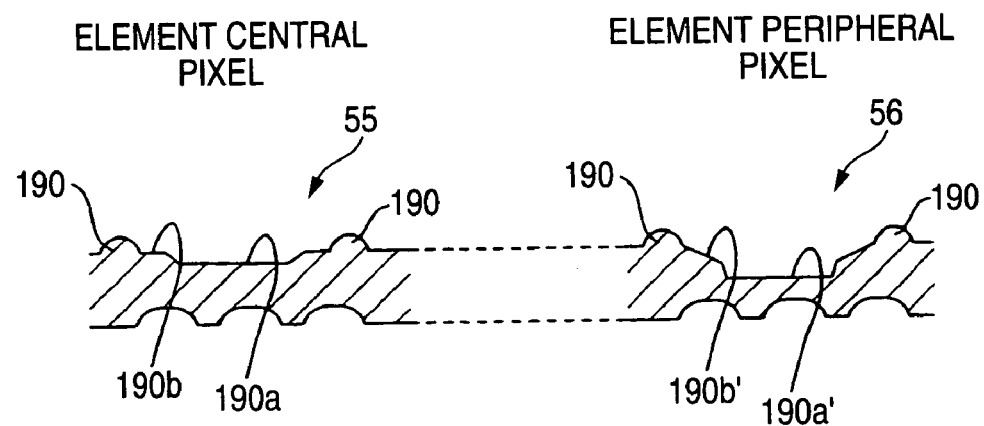

As in the third embodiment shown in FIG. 3, the photoelectric conversion layer-stacked solid-state imaging element according to the present embodiment is arranged such that the sectional shape of the light shielding layer provided under the various pixels are each formed concave so that the light which is obliquely incident cannot be reflected toward the adjacent pixels. As shown in FIG. 4B, in the present embodiment, the closer to a pixel 56 at the periphery of the element the pixel is, the greater is the depth of the concave portions 190a', 190b' of the light shielding layer than that of the concave portions 190a, 190b of the light shielding layer of the central pixel 55. This is because the closer to the periphery of the element the pixel is, the more obliquely light is incident. Thus, it is arranged such that the light reflected by the light shielding layer cannot be reflected toward the adjacent pixels.

In accordance with the invention, an arrangement is made such that when light which has been obliquely incident is reflected by the light shielding layer, it doesn't enter adjacent pixels. In this arrangement, the capability of separating image signal by pixels can be enhanced. At the same time, color mixing among pixels can be avoided. Thus, a high quality picture can be taken.

The photoelectric conversion layer-stacked solid-state imaging element according to the invention exhibits an enhanced capability of separating image signal by pixels and hence can avoid color mixing among pixels. Accordingly, the photoelectric conversion layer-stacked solid-state imaging element according to the invention is useful as a solid-state imaging element capable of taking a high quality color image to substitute for the related art CCD type or CMOS type image sensors.

The entire disclosure of each and every foreign patent application from which the benefit of foreign priority has been claimed in the present application is incorporated herein by reference, as if fully set forth.

What is claimed is:

1. A photoelectric conversion layer-stacked solid-state imaging element comprising:
    a semiconductor substrate having a signal reading circuit formed thereon;
    at least one layer of photoelectric conversion layer each of which is provided interposed between a common electrode layer and a plurality of pixel electrode layers corresponding to pixels, each of said pixels having a lower part, said at least one layer of photoelectric conversion layer being stacked above a light shielding layer which is positioned above the semiconductor substrate; and
    inhibiting structures below said photoelectric conversion layer adapted to inhibit a reflected light, which is produced by reflection of incident light on the light shielding layer after said light has passed through said at least one layer of photoelectric conversion layer and entered into a pixel, from entering in a direction toward adjacent pixels to the pixel.

2. The photoelectric conversion layer-stacked solid-state imaging element as defined in claim 1,
    wherein the inhibiting structures comprise shielding walls each of which is erected at a pixel border portion on the light shielding layer.

3. The photoelectric conversion layer-stacked solid-state imaging element as defined in claim 2,
    wherein the inhibiting structures further comprises concave portions formed on the light shielding layer, in which the sectional shape of the light shielding layer is concave, and each of the concave portions is located at the lower part of each of the pixels.

4. The photoelectric conversion layer-stacked solid-state imaging element as defined in claim 3,
   wherein each of the concave portions comprises:
   a first region having a first depth, corresponding to a periphery portion of each of the pixels; and
   a second region having a second depth greater than the first depth, corresponding to a center portion of each of the pixels.

5. The photoelectric conversion layer-stacked solid-state imaging element as defined in claim 3,
   wherein the concave portions have depths increasing from a center of a light-receiving surface of the solid-state imaging element toward a periphery of the light-receiving surface.

6. The photoelectric conversion layer-stacked solid-state imaging element as defined in claim 1,
   wherein the inhibiting structures comprise concave portions formed on the light shielding layer, in which the sectional shape of the light shielding layer is concave, and each of the concave portions is located at the lower part of each of the pixels.

7. The photoelectric conversion layer-stacked solid-state imaging element as defined in claim 6,
   wherein each of the concave portions comprises:
   a first region having a first depth, corresponding to a periphery portion of each of the pixels; and
   a second region having a second depth greater than the first depth, corresponding to a center portion of each of the pixels.

8. The photoelectric conversion layer-stacked solid-state imaging element as defined in claim 6,
   wherein the concave portions have depths increasing from a center of a light-receiving surface of the solid-state imaging element toward a periphery of the light-receiving surface.

* * * * *